US009386736B1

(12) United States Patent
Butterbaugh et al.

(10) Patent No.: US 9,386,736 B1
(45) Date of Patent: **\*Jul. 5, 2016**

(54) MODULAR ELEMENTS EMPLOYING LATCHES SECURED BY LINKAGES

(71) Applicant: International Business Machines Corporation, Armonk, NY (US)

(72) Inventors: Matthew A. Butterbaugh, Rochester, MN (US); Eric A. Eckberg, Rochester, MN (US); Camillo Sassano, Durham, NC (US); Kevin L. Schultz, Raleigh, NC (US); Scott A. Shurson, Mantorville, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/602,009

(22) Filed: Jan. 21, 2015

Related U.S. Application Data

(63) Continuation of application No. 14/588,514, filed on Jan. 2, 2015.

(51) Int. Cl.
*H05K 7/00* (2006.01)
*H05K 5/00* (2006.01)
*H05K 13/04* (2006.01)

(52) U.S. Cl.
CPC ................... *H05K 13/0486* (2013.01)

(58) Field of Classification Search
CPC .................................................. H05K 7/1409
USPC ....................... 361/679.01–679.03
See application file for complete search history.

(56) References Cited

U.S. PATENT DOCUMENTS

| 6,927,975 | B2 | 8/2005 | Crippen et al. |
| 6,939,319 | B1 * | 9/2005 | Anstead ................. A61M 5/30 604/68 |
| 6,956,745 | B2 | 10/2005 | Kerrigan et al. |
| 7,499,271 | B2 | 3/2009 | Wagatsuma et al. |
| 8,416,563 | B2 | 4/2013 | Hou |
| 9,152,189 | B2 | 10/2015 | Fan |
| 2004/0008497 | A1 * | 1/2004 | Barringer ............. H05K 7/1409 361/759 |

OTHER PUBLICATIONS

U.S. Appl. No. 14/588,214 entitled "Modular Elements Employing Latches Secured by Linkages", filed Dec. 31, 2014.
Appendix P: List of IBM Patents or Patent Applications Treated as Related.

\* cited by examiner

*Primary Examiner* — Jerry Wu
(74) *Attorney, Agent, or Firm* — Patterson + Sheridan, LLP

(57) ABSTRACT

Modular elements employing latches secured by linkages are disclosed. A modular element may include a chassis body in communication with a latch, control body, and control arm of the modular element. The modular element is removable from or secured to an enclosure using the latch. The latch may remain secured to the enclosure in a locked mode by being rotated to engage a control catch of a control arm of a linkage. By connecting the control arm to the control body with a rigid member connected to the control body with first and second rotary joints, the rigid member transforms a control body movement into a rotary motion of the control arm to disengage the control arm from the latch. In this manner, the modular element may be disengaged from the enclosure to facilitate upgrades or maintenance of electronic components supported by the chassis body.

9 Claims, 6 Drawing Sheets

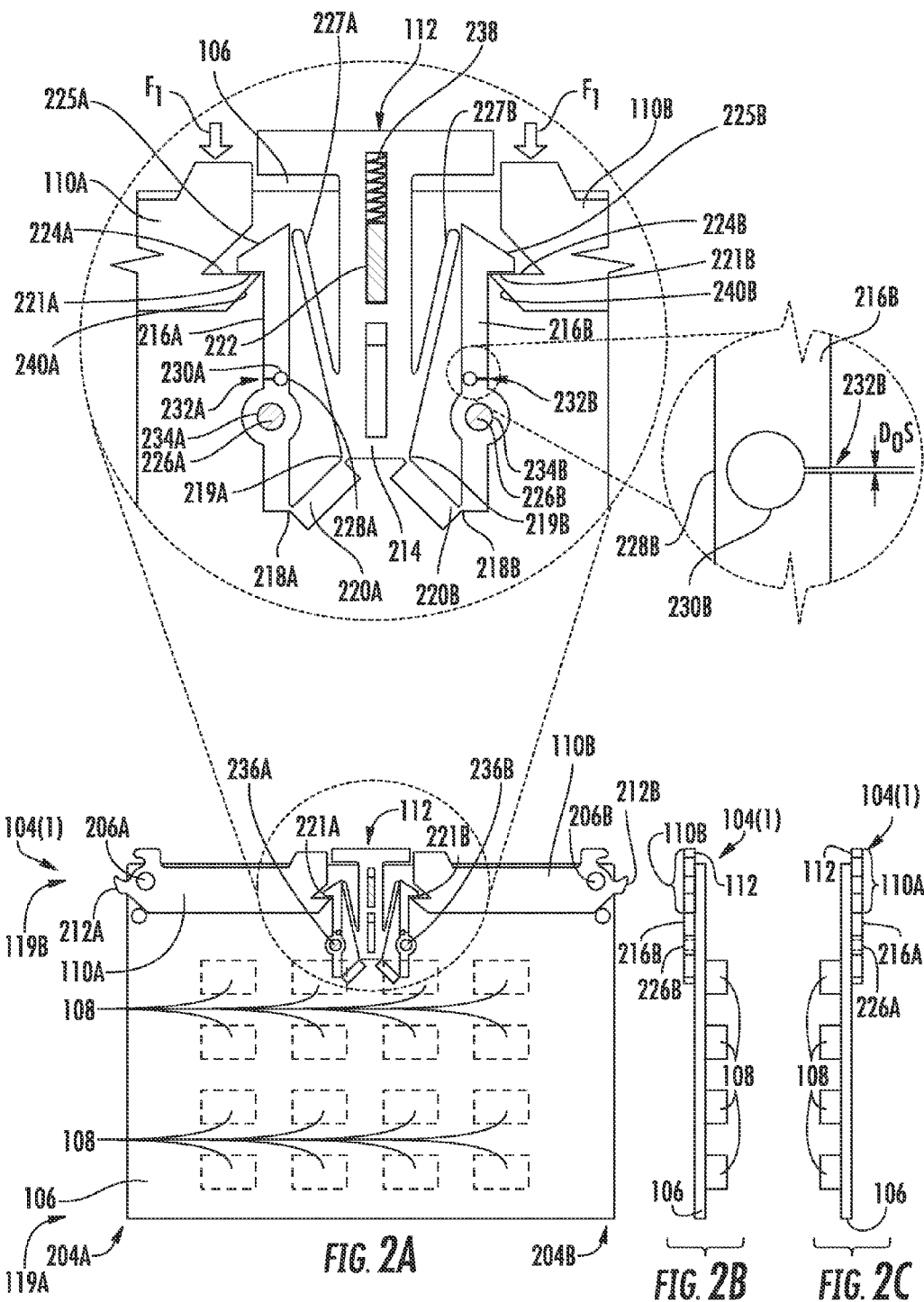

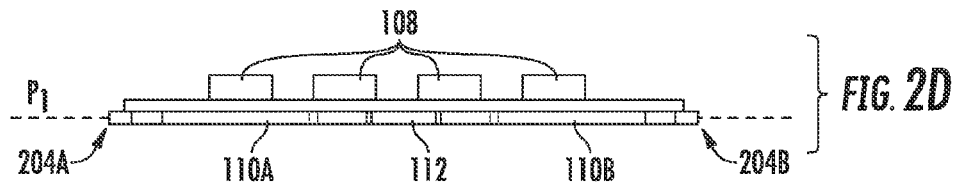
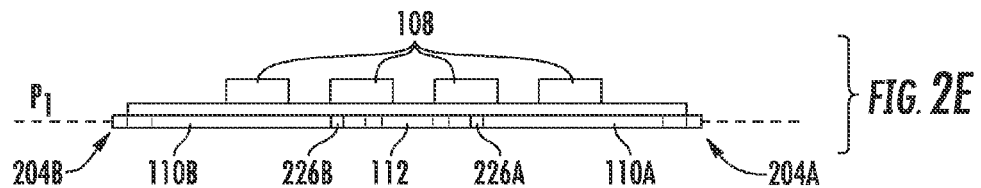
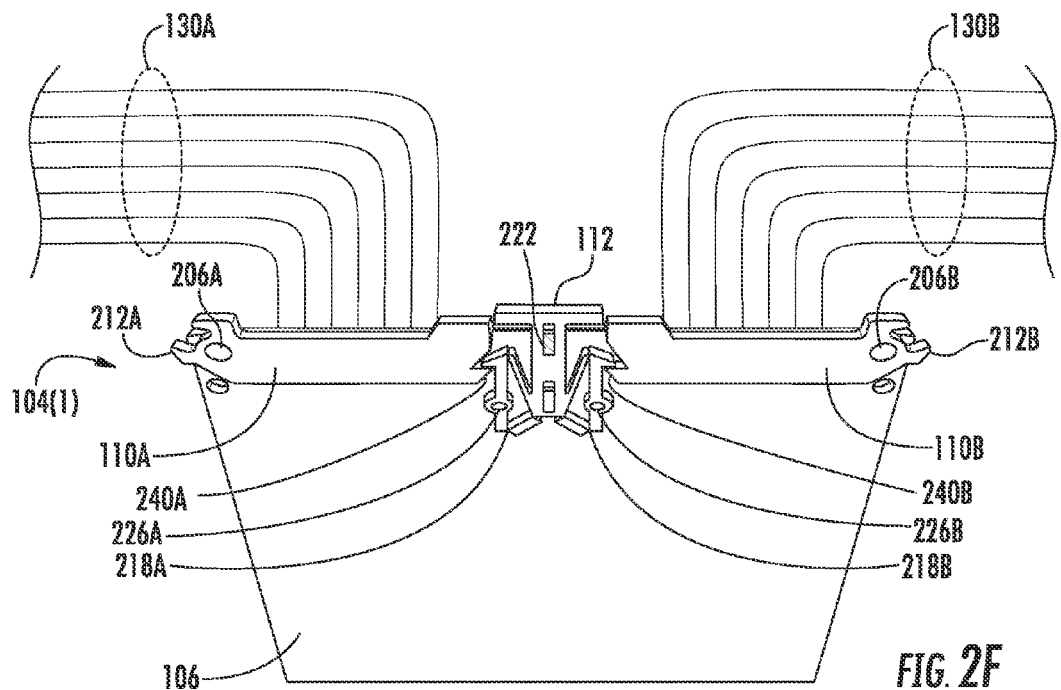
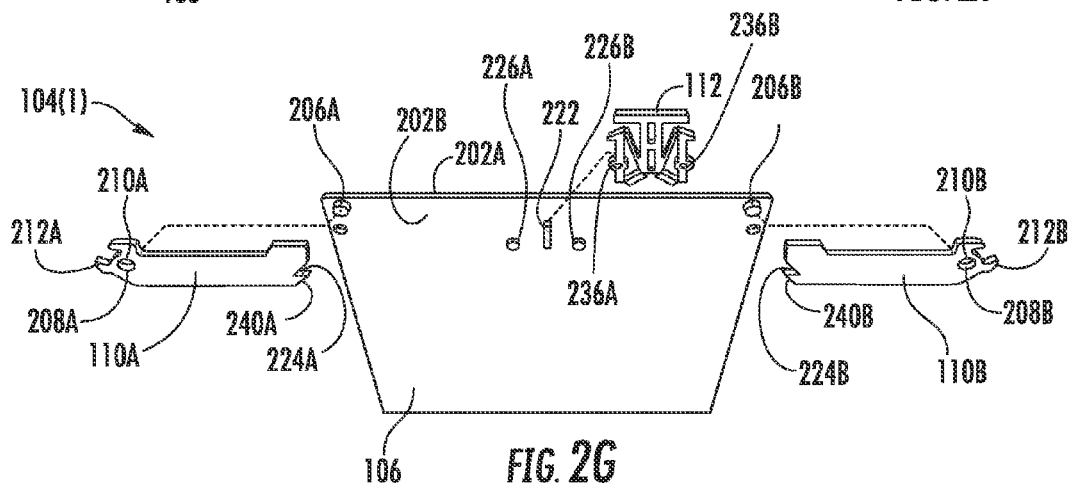

MODULAR ELEMENTS EMPLOYING LATCHES SECURED BY LINKAGES

CROSS-REFERENCE TO RELATED APPLICATIONS

This application is a continuation of co-pending U.S. patent application Ser. No. 14/588,214, filed Dec. 31, 2014. The aforementioned related patent application is herein incorporated by reference in its entirety.

BACKGROUND

The present disclosure relates to enclosure systems having removable equipment elements, and in particular, to electronic components supported by elements which are removable from enclosures.

TECHNICAL BACKGROUND

Benefits of enclosures include an establishment of an internal volume that provides protection and organization of the contents therein. In some applications, enclosures form a structural framework and protection of internal volumes. Protection may be provided, for example, from electromagnetic radiation, humidity, moisture, and heat. Items to be disposed within the internal volumes of enclosures may be supported as part of modular elements which are secured to the structural framework of the enclosure during use. The structural framework also precisely positions and holds firmly the modular elements, so that the internal volume may be precisely populated to optimize cooling flow, resist vibration, maximize storage capacity, and/or provide convenient interfaces for modular elements to be efficiently replaced ("swapped out") by personnel without damage when maintenance and/or upgrades are required.

As technology improves, demands to reduce cost while simultaneously increasing performance continues, and there is an increasing need to populate enclosures with higher densities of components within enclosures to reduce the footprints of data centers and improve the speed of electronic components by decreasing the distances therebetween. It is becoming more challenging, with the resultantly highly-populated enclosures, to identify spatial volumes within enclosures to route supply power cables and cooling air for components. Structural components of the enclosure and latches to secure the modular units to the enclosure are physically occupying spatial volume that could be occupied for additional electronic components or pathways for cooling air, communication cables, or power cords to support additional components in the enclosure. New approaches are needed to reliably secure modular units within enclosures while occupying minimum spatial volume, and facilitating efficient upgrades and maintenance.

SUMMARY

Embodiments disclosed herein include modular elements employing latches secured by linkages. A modular element may include a chassis body in communication with a latch, control body, and control arm of the modular element. The modular element is removable from or secured to an enclosure using the latch. The latch may remain secured to the enclosure in a locked mode by being rotated to engage a control catch of a control arm of a linkage. By connecting the control arm to the control body with a rigid member connected to the control body with first and second rotary joints, the rigid member transforms a control body movement into a rotary motion of the control arm to disengage the control arm from the latch. In this manner, the modular element may be disengaged from the enclosure to facilitate upgrades or maintenance of electronic components supported by the chassis body.

According to one embodiment of the present invention, a modular element is disclosed. The modular element is removable from an enclosure during an unlocked mode and secured in the enclosure during a locked mode. The modular element includes a chassis body supporting electronic components. The modular element further includes a latch in pivotable communication with the chassis body and configured to be engaged with the enclosure during the locked mode. The modular element further includes a linkage including a control body, a control arm, and a rigid member. The control body is in linear slidable communication with the chassis body between a first position during the locked mode and a second position during the unlocked mode. The control arm is in pivotable communication with the chassis, and the rigid member is connected to the control arm with a first rotary joint and connected to the control arm with a second rotary joint. Upon movement of the control body from the first position to the second position, the rigid member transforms motion of the control body into a rotary motion of the control arm to disengage a control catch of the control arm from a detent of the at least one latch. In this manner, the modular element may efficiently be secured and later removed from the enclosure to enable replacement of electronic components for maintenance or upgrades.

According to one embodiment of the present invention, a method for securing a modular element in a locked mode within an enclosure and later removing the modular element while in an unlocked mode from the enclosure is disclosed. The method includes disposing at least a portion of a chassis body of the modular element and electronic components supported by the chassis body within the enclosure. The modular element includes a latch and a linkage, wherein the linkage includes a control body, a control arm, and a rigid member. The control body is in a linear slidable communication with the chassis body and disposed at a first position during the locked mode and a second position during the unlocked mode. The control arm is in pivotable communication with the chassis. The rigid member is connected to the control arm with a first rotary joint and connected to the control arm with a second rotary joint. The method further includes, upon transitioning from the unlocked mode to the locked mode, pivoting the latch relative to the chassis body to engage the enclosure with the latch and to engage a detent of the latch with a control catch of a control arm, wherein the control arm is in pivotable communication with the chassis body. The method also includes, upon transitioning from the locked mode to the unlocked mode, moving the control body in a linear sliding motion from the first position to the second position, and transforming, with the rigid member and the first and second rotary joints, the linear motion of the control body into a rotary motion of the control arm to disengage the control catch from the detent. In this manner, the modular element may be efficiently secured and later removed from the enclosure with a reduced spatial volume enabling additional electronic components to populate the enclosure.

According to one embodiment of the present invention, an electronic device is disclosed. The electronic device includes an enclosure. The electronic device also includes a modular element removable from the enclosure. The modular element includes a chassis body supporting electronic components. The modular element further includes a latch in pivotable communication with the chassis body and configured to be engaged with the enclosure during the locked mode. The modular element further includes a linkage including a control body, a control arm, and a rigid member. The control body is in slidable communication with the chassis body between a first position during the locked mode and a second position during the unlocked mode. The control arm is in pivotable communication with the chassis, and the rigid member is connected to the control arm with a first rotary joint and connected to the control arm with a second rotary joint. The modular element further includes a flexible protrusion extending from the control body. Upon disposing the detent of the control catch adjacent to a detent of the latch during a transition from the unlocked mode to the locked mode, the flexible protrusion is configured to move towards the neutral position while urging the catch cam of the control arm into the detent of the latch. The flexible protrusion is disposed between the control arm and the control body. The modular element further includes upon movement of the control body from the first position to the second position the rigid member transforms motion of the control body into a rotary motion of the control arm to disengage a control catch of the control arm from a detent of the at least one latch. The first rotary joint and the second rotary joint each comprise living hinges. The latch, the control body, the control arm, and the link member are disposed in a co-planar arrangement during the locked and unlocked modes. In this manner, a high flow of airflow can be supplied to the electronic components in the enclosure with the small volume occupied by the control body and latch.

Additional features and advantages will be set forth in the detailed description which follows, and in part will be readily apparent to those skilled in the art from that description or recognized by practicing the embodiments as described herein, including the detailed description that follows, the claims, as well as the appended drawings.

It is to be understood that both the foregoing general description and the following detailed description disclose embodiments, and are intended to provide an overview or framework for understanding the nature and character of the disclosure. The accompanying drawings are included to provide a further understanding, and are incorporated into and constitute a part of this specification. The drawings illustrate various embodiments, and together with the description serve to explain the principles and operation of the concepts disclosed.

BRIEF DESCRIPTION OF THE SEVERAL VIEWS OF THE DRAWINGS OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIGS. 2A through 2G are a bottom view, right side view, left side view, front view, rear view, bottom perspective view, and bottom perspective exploded view of an exemplary one of the modular elements of FIG. 1, including a linkage foe securing the modular element within the enclosure of FIG. 1;

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein. Whenever possible, like reference numbers will be used to refer to like components or parts.

Embodiments disclosed herein include modular elements employing latches secured by linkages. A modular element may include a chassis body in communication with a latch, control body, and control arm of the modular element. The modular element is removable from or secured to an enclosure using the latch. The latch may remain secured to the enclosure in a locked mode by being rotated to engage a control catch of a control arm of a linkage. By connecting the control arm to the control body with a rigid member connected to the control body with first and second rotary joints, the rigid member transforms a control body movement into a rotary motion of the control arm to disengage the control arm from the latch. In this manner, the modular element may be disengaged from the enclosure to facilitate upgrades or maintenance of electronic components supported by the chassis body.

Figure 1:
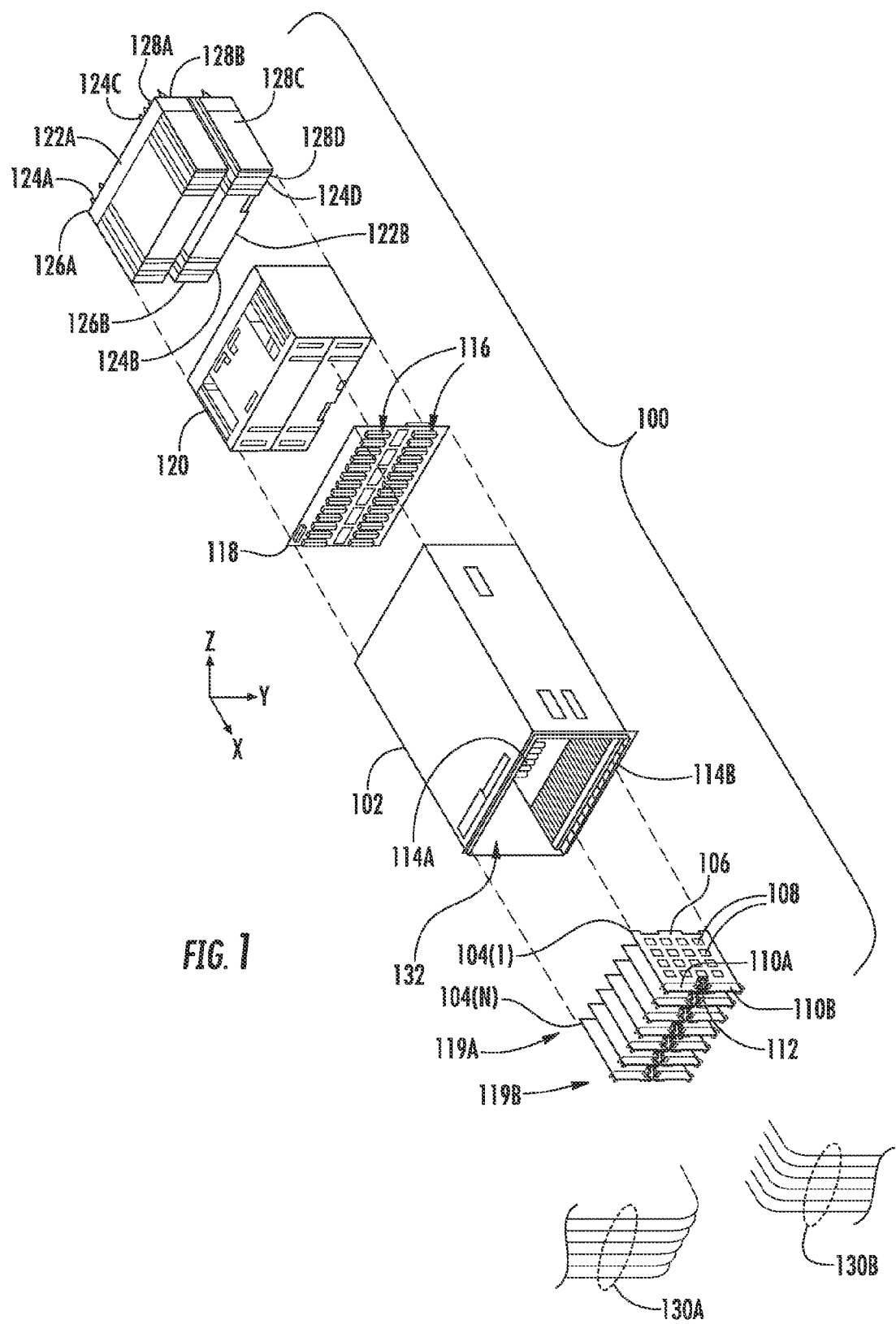
FIG. 1 is a top perspective exploded view of an exemplary electronic device including an enclosure and removable modular elements, wherein the modular elements each include a chassis body supporting electronic components, at least one latch, and a linkage.

FIG. 1 is a top perspective exploded view of an exemplary electronic device 100 including an enclosure 102 and removable modular elements 104(1)-104(N) which may be individually installed and later removed from the enclosure 102. Each of the removable modular elements 104(1)-104(N) includes a chassis body 106 supporting electronic components 108, at least one latch 110A, 110B, and a linkage 112 (discussed later relative to FIG. 2A) which secures the at least one latch 110A, 110B in a locked mode. The linkage 112 also has an unlocked mode to allow the latches 110A, 110B to disengage from the enclosure 102. The latches 110A, 110B may engage at least one receptor 114A, 114B of the enclosure 102 to secure the respective one of the modular element 104(1)-104(N) within the enclosure 102. At least one control arm 216A, 216B (FIG. 2A) of the linkage 112 is in communication with the chassis body 106 (as discussed later relative to FIG. 2B) to secure the latches 110A, 110B and maintain the respective modular element 104(1) secured to the enclosure 102. A disengagement force F2 (FIG. 4B) may be applied to the linkage 112 to enable the latches 110A, 110B to disengage from the enclosure 102. In this manner, each of the modular elements 104(1)-104(N) may be removably secured to the enclosure 102.

The electronic components 108 may be supported to respective ones of the chassis bodies 106 of the modular elements 104(1)-104(N). The electronic components 108 may, for example, include semiconductor-based processor and/or semiconductor-based storage components. When the modular elements 104(1)-104(N) are secured in the enclosure 102, the electronic components 108 of the modular elements 104(1)-14(N) may also be coupled (not shown) at the back 119A of the modular elements 104(1)-104(N) to connector slots 116 of a midplane 118. The connector slots 116 may include power and a signal interfaces for the electronic components 108 to function and exchange information with a second chassis 120. The second chassis 120 may contain various hot plug-able components for cooling, power, control, and switching. The second chassis 120 may slide to and latch onto the enclosure 102. The second chassis 120 may contain hot plug-able blowers 122A, 122B include backward-curved impeller blowers and provide cooling to various components of the electronic device 100. Airflow may be directed from the front to the rear of the second chassis 120. Each of the modular elements 104(1)-104(N) may includes a front grille to admit air, and low-profile vapor chamber based heat sinks to cool the electronic components 108. In one example, the total airflow through the electronic device 100 may be approximately 300 CFM at a 0.7 inch H2O static pressure drop.

With continued reference to FIG. 1, the electronic device 100 may also include power modules 124A-124D, management modules 126A, 126B, and switch modules 128A-128D. The power modules 124A-124D provide operating voltages for the electronic components 108. The management modules 126A, 126B may provide basic management functions, for example, controlling, monitoring, alerting, restarting, and diagnostics. The management modules 126A, 126B may have separate communications links (e.g. Ethernet) to the switch modules 128A-128D providing communications with the electronic components 108. In addition, communication cable groups 130A, 130B may be connected at a front 119B of the modular elements 104(1)-104(N). In this manner, power, communication, and environmental cooling may be provided to the electronic components 108 of the modular elements 104(1)-104(N).

FIGS. 2A through 2G are a bottom view, right side view, left side view, front view, rear view, bottom perspective view, and bottom perspective exploded view of the modular element 104(1) of the modular elements 104(1)-104(N) of FIG. 1. In this regard, the modular element 104(1) includes the chassis body 106, the at least one latch 110A, 110B, and the linkage 112. Each of these will now be discussed sequentially and in reference to the FIGS. 2A through 2G.

The chassis body 106 supports the electronic components 108 and serves as the structural foundation for each of the modular elements 140(1)-140(N). The chassis body 106 includes a first side 202A and a second side 202B opposite the first side 202A. The electronic components 108 may be attached to the first side 202A, second side 202B and/or within the chassis body 106. The first side 202A and the second side 202B extend from the front 119B to the back 119A of the modular element 104(1) and from a left side 204A of the modular element 104(1) to a right side 204B of the modular element 104(1). The chassis body 106 may comprise a strong material, for example, plastic, metal, or composites to prevent bending which may cause unwanted contact between adjacent modular elements 104(2)-104(N) and/or undesirable transient changes in cooling air passageways along the first side 202A and the second side 202B of the modular element 104(1). In this manner, the left side 204A and the right side 204B of the chassis body 106 are configured to be adjacent to or interface with the enclosure 102 to maximize the size of the modular element 104(1) for a given size of enclosure 102.

The chassis body 106 may provide electrical interconnection and may comprise a circuit board or other electronic interconnecting structure to provide power and intercommunication with the electronic components 108 supported thereon. The electronic components 108 may be supported from one or more of the first side 202A and the second side 202B. In some cases the electronic components 108 may be supported on an opposite side of the chassis body 106 from where the linkage 112 and the latches 110A, 110B communicate with the chassis body 106. In this manner, movement of the linkage 112 and the latches 110A, 110B may be unimpeded by a presence of the electronic components 108 on the opposite side of the chassis body 106.

With continued reference to FIGS. 2A through 2G, the latches 110A, 110B removably secure the chassis body 106 to the enclosure 102. The latches 110A, 110B respectively include catch portions 212A, 212B which are configured to be secured to the enclosure 102 by interfacing with the receptors 114A, 114B of the enclosure 102. The receptors 114A, 114B of the enclosure 102 may comprise holes or cavities within the enclosure 102 where the catch portions 212A, 212B may be received. Once the catch portions 212A, 212B are received by the receptors 114A, 114B, the receptors 114A, 114B prevent the latch 110A, 110B and the chassis body 106 attached to the latches 110A, 110B from being removed from the enclosure 102 until the catch portions 212A, 212B disengages from the receptors 114A, 114B.

The latches 110A, 110B are in pivotable communication with the chassis body 106. The pivotable communication may be created by spindles 206A, 206B which extend from the chassis body 106 and interface with inner surfaces 208A, 208B of the latches 110A, 110B. The inner surfaces 208A, 208B form respective holes 210A, 210B (FIG. 2G) of the latches 110A, 110B. The latches 110A, 110B may pivot relative to the chassis body 106 as the spindles 206A, 206B interface with the inner surfaces 208A, 208B. The modular element 104(1) is moved along a direction X (see FIG. 1) to be disposed in the enclosure 102 and in a suitable position to be secured within the enclosure 102. In order to secure the chassis body 106 within the enclosure 102, the at least one latch 110A, 110B may pivot relative to the chassis body 106, so that the catch portion 212A, 212B of the at least one latch 110A, 110B moves at least partially parallel in the Y-direction and into the receptors 114A, 114B of the enclosure 102. The pivoting of the latches 110A, 110B may occur by applying an installation force F1 to each of the latches 110A, 110B as depicted in FIG. 2A.

While the catch portion 212A, 212B of the latches 110A, 110B remain disposed within the receptors 114A, 114B of the enclosure 102, the receptors 114A, 114B restrict movement of the catch portions 212A, 212B of the latches 110A, 110B in the X-direction. As long as the latches 110A, 110B remain stationary relative to the chassis body 106, the catch portions 212A, 212B of the latches 110A, 110B remain engaged in the receptors 114A, 114B of the enclosure 102 and the modular element 104(1) is prevented from movement in the X-direction out of the opening 132 (FIG. 1) of the enclosure 102. The enclosure 102 may prevent movement of the chassis body 106 parallel to the Y-direction. In this manner, the latches 110A, 110B removably secure the modular element 104(1) within the enclosure 102.

The linkage 112 may be utilized to secure the latches 110A, 110B in the locked mode and to later unsecure the latches 110A, 110B by facilitating a transition to an unlocked mode. In particular, the linkage 112 secures the latches 110A, 110B engaged with the receptors 114A, 114B of the enclosure 102 while in the locked mode. The linkage 112 includes a control body 214, at least one control arm 216A, 216B, and at least one rigid member 220A, 220B (or "at least one rigid body"). The control body 214 is in slidable communication with the chassis body 106 and may include a linear slide 222 to enable movement of the control body 214 between a first position 223A and a second position 223B. In this regard, the control body 112 is in the first position 223A during a locked mode when the modular element 104(1) is secured to the enclosure 102 and in the second position 223B during the unlocked mode when the latches 110A, 110B are mobilized and able to disengage from the enclosure 102. The control body 214 may receive a disengagement force F2 (as discussed later in FIG. 5B) to enable the user to mobilize the latches 110A, 110B. The linear slide 222 may facilitate movement of the control body 214 to be parallel to a direction, for example the X-direction depicted in FIG. 1, in which the modular element 104 is urged into and removed from the enclosure 102. In this manner, the control body 214 may be easily accessible to the user at the front 119B (FIG. 1) of the modular element 104(1), and also the movement of the control body 214 is symmetric to the latches 110A, 110B enabling similar operation of the latches 110A, 110B on the left 204A and the right side 204B (FIG. 2A) respectively of the modular element 104(1) to more equally distribute the loads on the enclosure 102 to reduce maintenance.

The control arms 216A, 216B of the linkage 112 engage and disengage with the latches 110A, 110B when the latches 110A, 110B are in the locked mode and unlocked mode respectively. When engaged, the latches 110A, 110B are stationary relative to the chassis body 106.

The control arms 216A, 216B include features to engage with the latches 110A, 110B. In particular, the control arms 216A, 216B include the control catches 221A, 221B, for example in the shape of a protruding lip, which are configured to be received within detents 224A, 224B of the latches 110A, 110B. When the control catches 221A, 221B are received in the detents 224A, 224B of the latches 110A, 110B, then the latches 110A, 110B are prevented from rotating relative to the chassis body 106 and disengaging from the enclosure 102. In this manner, the latches 110A, 110B may be secured in a locked mode to prevent the latches 110A, 110B from disengaging from the enclosure 102.

The detents 224A, 224B are first disposed adjacent to the control catches 221A, 221B in order to enable the control catches 221A, 221B to be engaged with the detents 224A, 224B in the locked mode. During this transition from the unlocked mode to the locked mode, the latches 110A, 110B are configured to receive the installation force F1 (or installation movement) from the user to rotate the latches 110A, 110B relative to the control arms 216A, 216B and dispose the detents 224A, 224B of the latches 110A, 110B adjacent to the control catches 221A, 221B of the control arms 216A, 216B. The control arms 216A, 216B may include at least one angled surface 225A, 225B (FIG. 2A) which are angled relative to the longitudinal axes of the control arms 216A, 216B. In this regard, the angled surfaces 225A, 225B are configured to abut against the latches 110A, 110B and ease the relative movement of the control arms 216A, 216B including the control catches 221A, 221B along the perimeter of the latches 110A, 110B to the detents 224A, 224B of the latches 110A, 110B. The latches 110A, 110B may also include chamfers 240A, 240B to form at least part of the perimeter of the latches 110A, 110B and ease the relative movement of the control arms 216A, 216B along the perimeter. Once the detents 224A, 224B are disposed adjacent to the control catches 221A, 221B and the control catches 221A, 221B urged therein, then the engagement occurs which secures the latches 110A, 110B.

Two features acting cooperatively with the angled surfaces 225A, 225B to dispose the control catches 221A, 221B within the detents 224A, 224B are at least one angular joint 228A, 228B and at least one flexible protrusion 227A, 227B. The angular joints 228A, 228B are respectively included as part of the control arms 216A, 216B and formed by internal surfaces 230A, 230B of the control arms 216A, 216B. The angular joints 228A, 228B are flexible portions of the control arms 216A, 216B angular joint which are configured to facilitate deformation of the control arms 216A, 216B, so that the control arms 216A, 216B including the control catches 221A, 221B may more easily follow the perimeter of the latches 110A, 110B, so that the control catches 221A, 221B are disposed adjacent to the detents 224A, 224B. The flexibility provided by the angular joints 228A, 228B avoids moving the control body 214 when securing the latches 110A, 110B in the locked mode. In this regard, less energy is required to secure the latches 110A, 110B. Once the control catches 221A, 221B are disposed adjacent to the detents 224A, 224B, then the flexible protrusions 227A, 227B may urge the control catches 221A, 221B into the detents 224A, 224B. The flexible protrusions 227A, 227B may extend from the control body 214 to distal ends of the flexible protrusions 227A, 227B, so as to be positioned precisely relative to the control arms 216A, 216B which are in communication with the control body 214 through the rigid members 220A, 220B. The flexible protrusions 227A, 227B may have sufficient rigidity, so as to be self-biased toward a neutral position when distal ends of the flexible protrusions 227A, 227B are adjacent to or abutting against the control arms 216A, 216B and the control catches 221A, 221B and the detents 224A, 224B are engaged in the locked position. Accordingly, the flexible protrusions 227A, 227B move away from their neutral positions as the angled surfaces 225A, 225B abut against the perimeter of the latches 110A, 110B as the installation force F1 is applied to the latches 110A, 110B and the control catches 221A, 221B become disposed adjacent to the detents 224A, 224B. When the control catches 221A, 221B become disposed adjacent to the detents 224A, 224B, then the flexible protrusions 227A, 227B may move towards their neutral positions and may urge the control catches 221A, 221B into the detents 224A, 224B. Accordingly, the latches 110A, 110B are secured and unable to disengage from the enclosure 102 when the control catches 221A, 221B are received in the detents 224A, 224B of the latches 110A, 110B. In this manner, the angular joints 228A, 228B and the flexible protrusions 227A, 227B may facilitate the securing of the latches 110A, 110B in the locked mode wherein the latches 110A, 110B remain secured with the catch portions 212A, 212B engaged in the receptors 114A, 114B (FIG. 1) of the enclosure 102 and the modular element 104(1) is prevented from movement in the X-direction out through the opening 132 of the enclosure 102.

With continued reference to FIGS. 2A through 2G, several components of the modular element 104(1) work together to enable the unlocked mode where the modular element 104(1) may be removed from the enclosure 102. In this regard, the control arms 216A, 216B are in pivotable communication with the chassis body 106 and are actuated by the control body 214 through the rigid members 220A, 220B. In particular, the rigid members 220A, 220B are respectively connected to the control arms 216A, 216B with first rotary joints 218A, 218B and connected to the control body 214 with second rotary joints 219A, 219B. The rigid members 220A, 220B enable the control arms 216A, 216B to pivot relative to the control body 214 and the chassis body 106. The first rotary joints 218A, 218B and the second rotary joints 219A, 219B may be, for example, flexure bearings such as living hinges. These connections of the rigid members 220A, 220B between the control body 214 and the control arms 216A, 216B enable movements of the control body 214 (for example from a disengaging force F2 which discussed later) to be transformed by the rigid members 220A, 220B into a rotary motion of the control arms 216A, 216B to disengage the control arms 216A, 216B from the latches 110A, 110B when transitioning between the locked mode and the unlocked mode.

Once the control arms 216A, 216B disengage from the latches 110A, 110B as the control body 214 moves from the first position 223A to the second position 223B, then the control body 214 may be returned to the first position 223A by distal ends of the flexible protrusions 227A, 227B moving towards and against the control arms 216A, 216B. The linkage 112 may include an optional spring 238 (FIG. 2A) coupled between the control body 214 and the chassis body 106 to facilitate the movement of the control body back to the first position 223A once the latches 110A, 110B are disengaged from the control arms 216A, 216B. If the flexible protrusions 227A, 227B are strong enough, then the spring 238 may not be needed. In this manner, the control body 214 may be prepositioned in the case when the latches 110A, 110B are returned to the locked mode.

It is noted that the pivotable communication of the control arms 216A, 216B with the chassis body 106 may be provided by control arm spindles 226A, 226B which extend from the chassis body 106 and interface with inner surfaces 234A, 234B of the control arms 216A, 216B. The inner surfaces 234A, 234B form respective holes 236A, 236B (FIG. 2G) of the control arms 216A, 216B. The control arms 216A, 216B may pivot relative to the chassis body 106 as the control arm spindles 226A, 226B interface with the inner surfaces 234A, 234B of the control arms 216A, 216B.

Figures 3A, 3B:
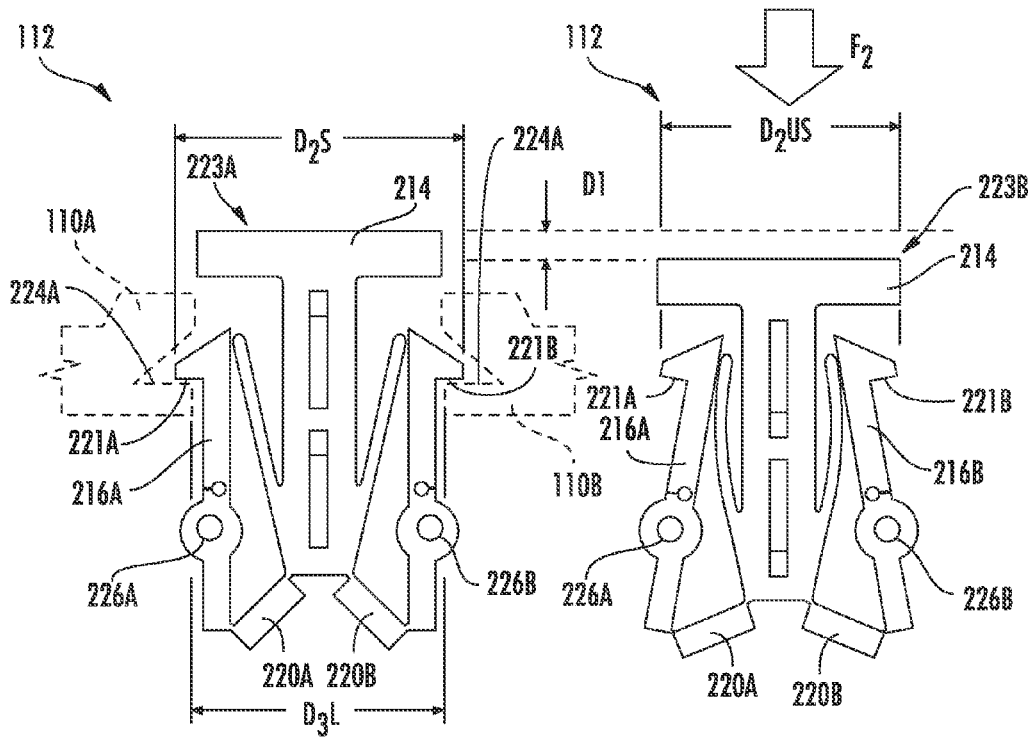
FIGS. 3A and 3B are bottom views of the linkage of FIG. 2A in the locked mode and unlocked mode respectively.

In order to illustrate the transition from the locked mode to the unlocked mode, FIGS. 3A and 3B are bottom views of the linkage 112 of FIG. 2A in the locked mode and unlocked mode respectively. FIG. 3A shows the control catches 221A, 221B engaged with the latches 110A, 110B in the locked mode wherein a maximum distance $D_2S$ between the control catches 221A, 221B is greater than a minimum distance $D_3L$ between the detents 224A, 224B of the latches 110A, 110B. Accordingly, the latches 110A, 110B are secured and are restricted from pivoting relative to the chassis body 106 so that the latches 110A, 110B may be unsecured from the enclosure 102. In contrast FIG. 3B illustrates the unlocked position wherein a disengaging force F2 from a user is received by the control body 214 to move the control body a distance D1 from a first position 223A to a second position 223B. The distance D1 moved by the control body 214 is transformed by the rigid members 220A, 220B into rotary motions of the control arms 216A, 216B, for example, to reduce the maximum distance between the control catches 221A, 221B to a distance $D_2US$ which is less than the minimum distance $D_3L$. Thus, the control catches 221A, 221B of the control arms 216A, 216B disengage from the detents 224A, 224B of the latches 110A, 110B. Upon disengaging the control catches 221A, 221B from the detents 224A, 224B, then the latches 110A, 110B may rotate and disengage the modular element 104(1) from the enclosure 102 (FIG. 1). The modular elements 104(2)-104(N) may operate in a similar manner as modular element 104(1).

Figure 3C:
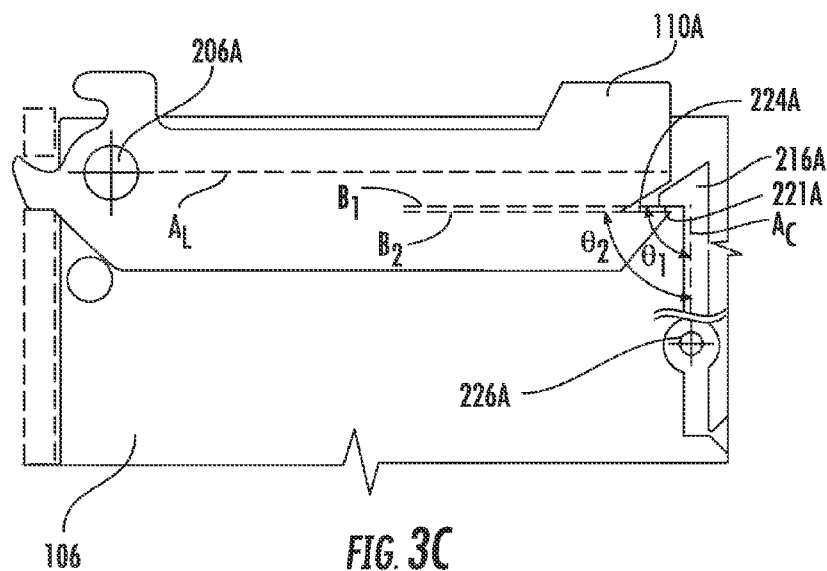
FIG. 3C is a bottom view of one of the latches of the linkage of FIG. 2A engaged with one of the control arms of FIG. 2A to illustrate angular relationships of the detent of the respective latch and the control catch of the respective control arm.

FIG. 3C is a bottom view of latch 110A of the latches 110A, 110B of the linkage 112 of FIG. 2A engaged with the control arm 216A of the control arms 216A, 216B of FIG. 2A to illustrate angular relationships of the detent 224A of the respective latch 110A and the control catch 221A of the respective control arm 216A. It is noted that in the preferred engagement between the control catch 221A and the detent 224A, the control catch 221A is disposed along a line B1 at angle θ1 (theta_1) which is orthogonal to a radial vector Ac extending from an axis of rotation of the control arm 216A. Further, in this preferred engagement the detent 224A is orientated along a line B2 which is parallel to a radial vector AL extending from an axis of rotation of the latch 110A. In this manner, the control catch 221A, and the detent 224A may remain engaged in a relatively stable arrangement while in the locked mode to prevent the latch 110A from rotating and disengaging from the enclosure 102.

It is noted that the linkage 112 and the latches 110A, 110B of the modular element 104(1) may be disposed and/or move within a geometric plane P1 (see FIGS. 2D and 2E). This co-planar arrangement and movement has several benefits. Cooling airflow provided to the electronic components 108 may be increased as the linkage 112 and the latches 110A, 110B of the modular element 104(1) may be disposed adjacent to the chassis body 106. This adjacent arrangement provides minimal obstruction to the airflow (not shown) which may be directed parallel to the first side 202A and/or a second side 202B of the chassis body 106. Also, the linkage 112 and the latches 110A, 110B may be made lighter and more compact to accommodate co-planar movements and forces within the geometric plane P1 and avoid more complex and/or unnecessary structure. The complex structure which has been avoided would be needed to accommodate movements and/or forces outside of the geometric plane P1. In this manner, the modular element 104(1) may more efficiently provide cooling to the electronic components 108 and reduce costs.

Figure 4:
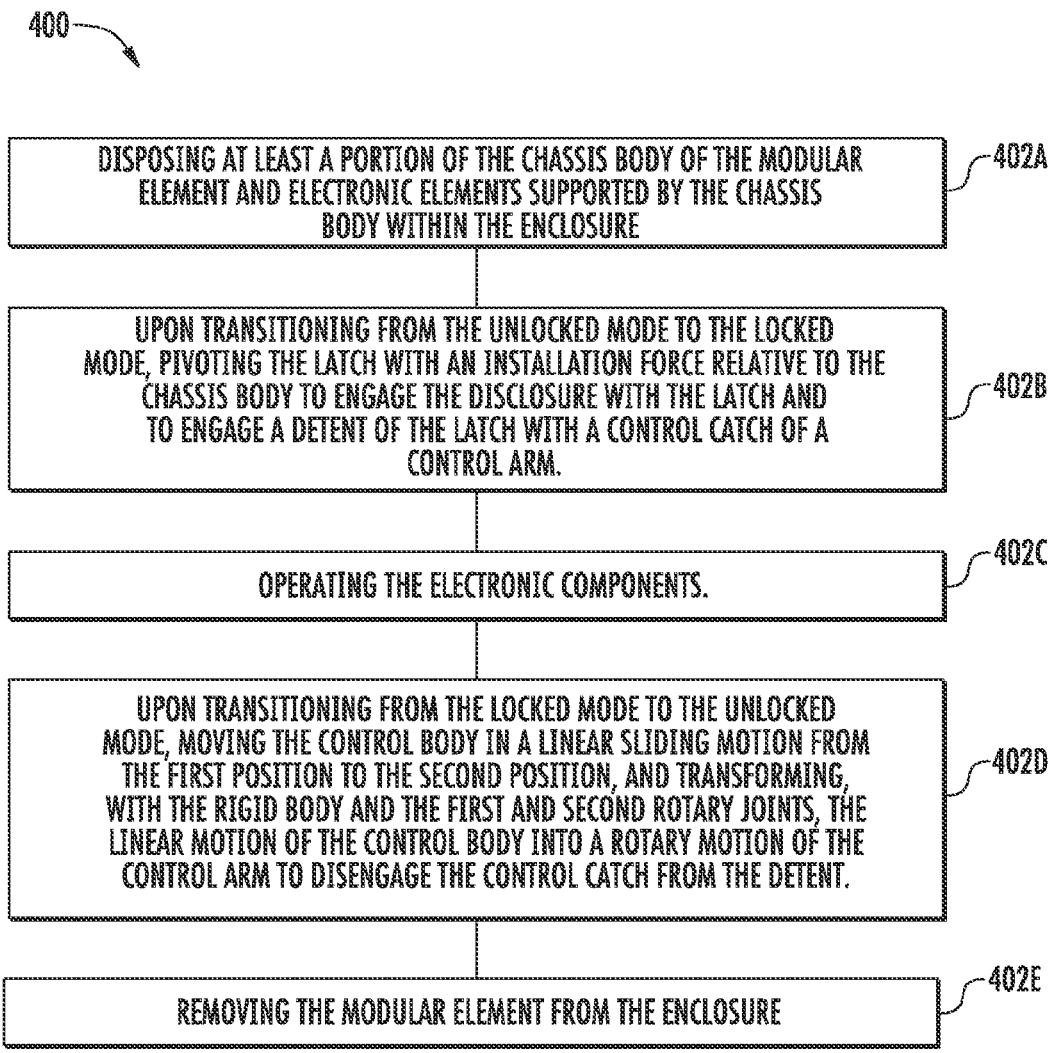
FIG. 4 is a flowchart of an exemplary method for securing the modular element of FIG. 2A within the enclosure of FIG. 1 before removing the modular element.
Figure 5A:
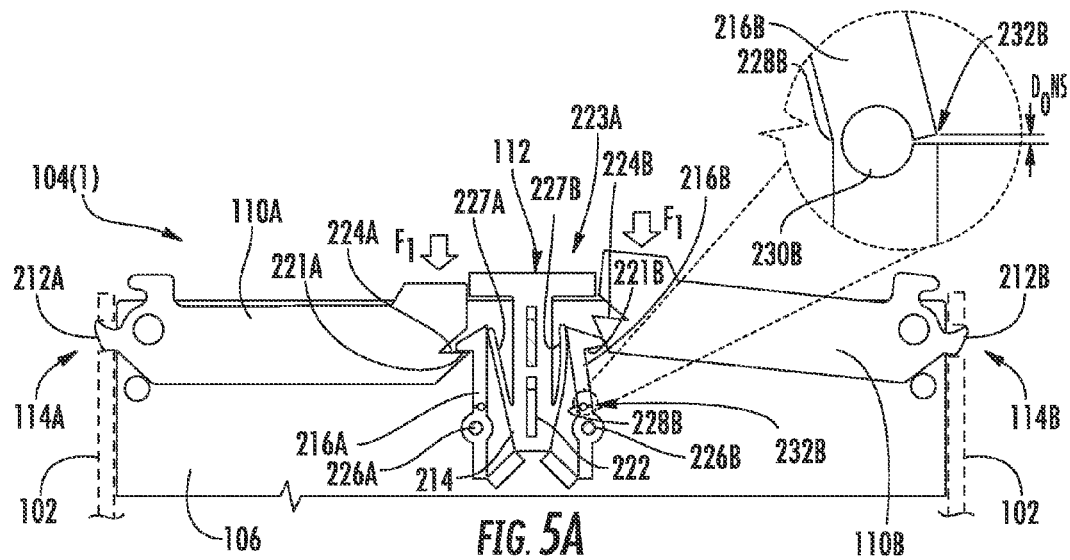
FIG. 5A is a bottom view of the modular element of FIG. 2A being secured to receptors of the enclosure and the at least one latch of the modular element being secured in the locked mode by the control body.

FIG. 4 is a flowchart of an exemplary method 400 for securing the modular element 104(1) of FIG. 2A within the enclosure 102 of FIG. 1 and removing the modular element 104(1) from the enclosure 102. The method 400 is now discussed using the terminology discussed above in relation to the operations 402A-402E as depicted in FIG. 4. In this regard, the method 400 includes disposing at least a portion of the chassis body 106 of the modular element 104(1) and electronic components 108 supported by the chassis body 106 within the enclosure 102 (operation 402A of FIG. 4). As shown in FIG. 5A, the method 400 also includes upon transitioning from the unlocked mode to the locked mode, pivoting the latches 110A, 110B with the installation force F1 relative to the chassis body 106 to engage the enclosure 102 with the latches 110A, 110B and to engage the detents 224A, 224B of the latches 110A, 110B with the control catches 221A, 221B of the control arms 216A, 216B (operation 402B of FIG. 4). FIG. 5A depicts the installation force F1 applied to both the latches 110A, 110B wherein the detent 224A of the latch 110A has become engaged with the control catch 221A of the control arm 216A. For purposes of illustration, the latches 110A, 110B are illustrated at different levels of engagement wherein the detent 224B of the latch 110B is not yet engaged with the control arm 216B. In this regard, the installation force F1 is received by the latch 110B the angular joint 228B of the control arm 216B is deformed to enable the control catch 221B to become adjacent to the detent 224B so that the flexible protrusion 227B may move toward its neutral position and urge the control catch 221B into the detent 224B to complete the engagement of the latch 110B with the control arm 216B.

It is noted that gaps of the rotational stops 232A, 232B at the angular joints 228A, 228B widen as depicted by the distance $D_0NS$ when the respective one of the angular joints 228A, 228B deform when the control catches 221A, 221B are disposed adjacent to the detents 224A, 224B and the gaps of the rotational stops 232A, 232B decrease as the flexible protrusions urge the control catches 221A, 221B into the detents 224A, 224B.

The method 400 may also include operating the electronic components 108 (operation 402D of FIG. 4). The operation may include, for example, exchanging information between the electronic components 108 and the communication cable groups 130A, 130B (FIG. 1).

Figure 5B:
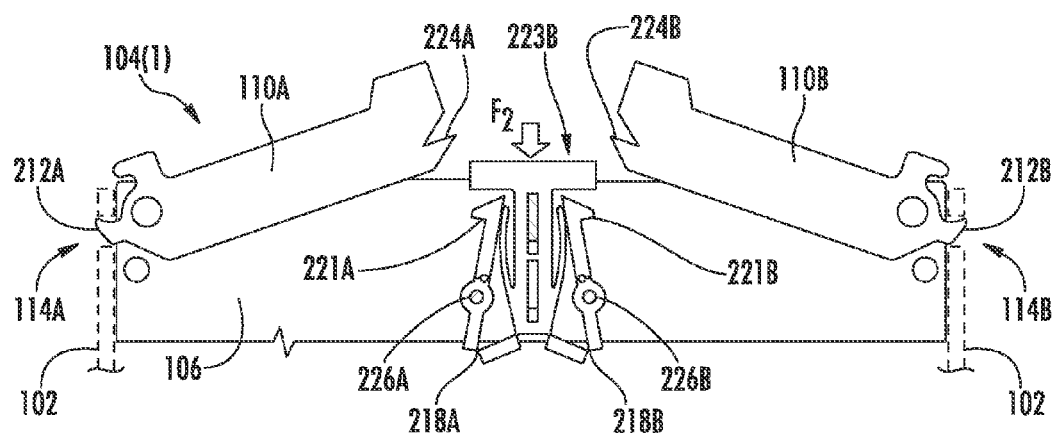
FIG. 5B is a bottom view of the modular element of FIG. 5A illustrating a disengagement force being applied to the control body of the modular element to mobilize the at least one latch.

One or more of the modular elements 104(1)-104(N) may be removed when maintenance or upgrades are required. When removal is initiated, the modular elements 104(1)-104(N) are unsecured from the enclosure 102 to facilitate removal in the unlocked mode. In this regard, as shown in FIG. 5B, the method 400 may include, upon transitioning from the locked mode to the unlocked mode, moving the control body 214 in a linear sliding motion from the first position 223A to the second position 223B, and transforming, with the rigid member 220A, 220B, the first rotary joints 218A, 218B and second rotary joints 219A, 219B, the linear motion of the control body 214 into the rotary motions of the control arms 216A, 216B to disengage the control catches 221A, 221B from the detents 224A, 224B (operation 402D of FIG. 4). In this manner, the latches 110A, 110B become free to move about the latch spindles 206A, 206B and disengage the catch portions 212A, 212B of the latches 110A, 110B from the enclosure 102 to enable the modular element 104(1) to be removed from the enclosure 102.

Figure 5C:
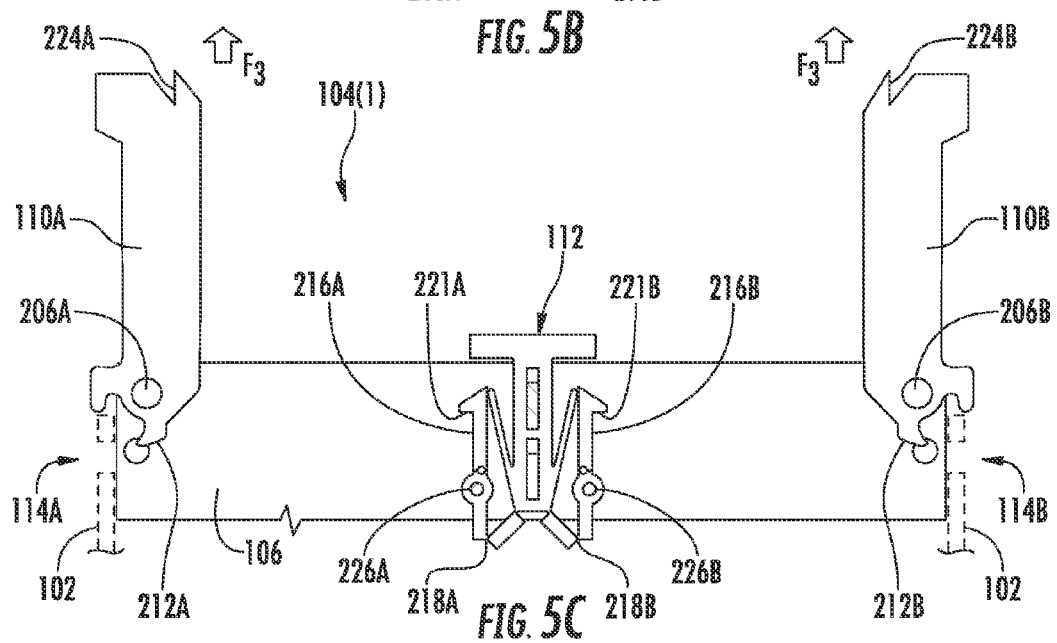
FIG. 5C is a bottom view of the modular element of FIG. 5B illustrating removing the modular element from the enclosure by applying a removal force to the at least one latch.

As depicted in FIG. 5C, the method 400 may also include removing the modular element 104(1) from the enclosure 102 with an application of a removal force F3 to the latches 110A, 110B (operation 402E of FIG. 4). The modular element 104(1) may in some cases slide along a rail (not shown) of the enclosure 102 as the removal force F3 is applied. In this manner, the modular element 104(1) may be removed from the enclosure 102.

It is noted that at this situation illustrated in FIG. 5C that the rotational stops 232A, 232B may limit the distance that the flexible protrusions 227A, 227B can urge the control arms 216A, 216B away from the control body by reducing the gap $D_0NS$ (FIG. 5A) to zero. In this manner, the control arms 216A, 216B may be precisely positioned to receive the latches 110A, 110B if the installation force F1 were to again be applied to the latches 110A, 110B to subsequently initiate the locked mode.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

Many modifications and other embodiments not set forth herein will come to mind to one skilled in the art to which the embodiments pertain having the benefit of the teachings presented in the foregoing descriptions and the associated drawings. Therefore, it is to be understood that the description and claims are not to be limited to the specific embodiments disclosed and that modifications and other embodiments are intended to be included within the scope of the appended claims. It is intended that the embodiments cover the modifications and variations of the embodiments provided they come within the scope of the appended claims and their equivalents. Although specific terms are employed herein, they are used in a generic and descriptive sense only and not for purposes of limitation.

While the foregoing is directed to embodiments of the present invention, other and further embodiments of the invention may be devised without departing from the basic scope thereof, and the scope thereof is determined by the claims that follow.

What is claimed is:

1. A method for securing a modular element in a locked mode within an enclosure and removing the modular element while in an unlocked mode from the enclosure, the method comprising: disposing at least a portion of a chassis body of the modular element and electronic components supported by the chassis body within the enclosure, wherein the modular element includes latches and a linkage, wherein the linkage includes a control body, control arms, and rigid members, wherein the control body is in linear slidable communication with the chassis body and disposed between a first position during the locked mode and a second position during the unlocked mode, the control arms are in pivotable communication with the chassis, and the rigid members are connected to the control arms with a first rotary joint and a second rotary joint respectively; upon transitioning from the unlocked mode to the locked mode, pivoting the latches relative to the chassis body to engage the enclosure with the latches and to engage a detent of each latch with a control catch of the corresponding control arm, wherein each control arm is in pivotable communication with the chassis body; and upon transitioning from the locked mode to the unlocked mode, moving the control body in a linear sliding motion from the first position to the second position, and transforming, with the rigid members and the first and second rotary joints, the linear motion of the control body into a rotary motion of the control arms to disengage the control catches from the detents respectively.

2. The method of claim 1, further comprising receiving, with the control body, a disengaging motion from a user which moves the control body from the first position to the second position.

3. The method of claim 1, further comprising moving, with the rotary motion of the control arm, a flexible protrusion away from a neutral position of the flexible protrusion upon movement of the control body from the first position to the second position, wherein the flexible protrusion extends from the control body.

4. The method of claim 3, wherein the flexible protrusion is disposed between the control arm and the control body.

5. The method of claim 1, wherein the engaging the detent of the latch with the control catch of a control arm includes: receiving, with the latch from the user, an installation force to pivot the latch relative to the control arm and dispose a catch cam of the control arm adjacent to a detent of the latch.

6. The method of claim 5, wherein the engaging the detent of the latch with the control catch of a control arm further includes: urging, with a flexible protrusion moving towards a neutral position of the flexible protrusion, the control catch into the detent, wherein the flexible protrusion extends from the control body.

7. The method of claim 6, wherein the engaging the detent of the latch with the control catch of a control arm further includes: deforming the control arm at an angular joint of the control arm to facilitate disposing the control catch adjacent to the detent.

8. The method of claim 7, wherein the urging the control catch into the detent includes: limiting, with a rotational stop of the control arm, the movement of the control catch in the unlocked mode wherein the rotational stop includes a gap of the control arm which fully closes to limit movement of the control catch.

9. The method of claim 3, wherein the latch, the control body, the control arm, and the link member are disposed in a co-planar arrangement during the locked and unlocked modes.

\* \* \* \* \*